United States Patent [19]

Yamaguchi et al.

[11] Patent Number: 4,805,006
[45] Date of Patent: Feb. 14, 1989

[54] LIGHT RECEIVING ELEMENT

[75] Inventors: Shuichiroh Yamaguchi; Yukio Idaka; Takeshi Matsumoto; Tatsuhiko Irie, all of Kadoma, Japan

[73] Assignee: Matsushita Electric Works, Ltd., Osaka, Japan

[21] Appl. No.: 166,370

[22] Filed: Mar. 10, 1988

[30] Foreign Application Priority Data

Mar. 25, 1987 [JP] Japan ............... 62-43795[U]

[51] Int. Cl.$^4$ .................. H01J 40/14; H01L 27/14; H01L 31/00
[52] U.S. Cl. ........................ 357/30; 357/32; 250/209; 250/578
[58] Field of Search ............... 357/30 H, 30 I, 30 J, 357/30 P, 32; 250/209, 578

[56] References Cited

U.S. PATENT DOCUMENTS

| 3,617,825 | 11/1971 | Chilton et al. | 357/32 |
| 4,227,098 | 10/1980 | Brown et al. | 307/311 |
| 4,315,096 | 2/1982 | Tyan et al. | 357/30 |

FOREIGN PATENT DOCUMENTS 0009178  1/1985  Japan ...................... 357/30

Primary Examiner—Eugene R. LaRoche
Assistant Examiner—Michael Shingleton
Attorney, Agent, or Firm—Burns, Doane, Swecker & Mathis

[57] ABSTRACT

A light receiving element is formed by a plurality of light receiving cells connected in series with one another and arranged for optical coupling to a light source, the cells having respectively a surface area varied depending on light input intensity from the light source. The light receiving cells are thereby made to maintain excellent light receiving efficiency without causing optical loss at any one of them.

4 Claims, 3 Drawing Sheets

LIGHT RECEIVING ELEMENT

TECHNICAL BACKGROUND OF THE INVENTION

This invention relates to a light receiving element which comprises a plurality of light receiving cells connected in series with one another and arranged to be optically coupled to a light source.

The light receiving element according to the present invention may be employed as an array of photodiodes optically coupled to such light source as a light-emitting diode, and is useful particularly when applied to a semiconductor switching circuit for driving such output FET as, preferably, a metal-oxide semiconductor field-effect-transistor known as MOSFET, by means of an electric signal into which an input light signal is converted.

DISCLOSURE OF PRIOR ART

One of the light receiving elements of the kind referred to has been suggested in U.S. Pat. No. 4,227,098 by Dale M. Brown et al, in which a photovoltaic diode array connected to MOSFET for applying an electromotive force across gate and source electrodes of MOSFET is optically coupled to a light emitting diode. When, in this arrangement, MOSFET is in its enhancement mode, a shift from OFF-state to ON-state is achieved across both output terminals of MOSFET upon generation of photovoltage. Further, as seen clearly in FIGS. 8 and 9 of the patent to Brown et al, there has been disclosed that the photovoltaic diode array as a light receiving element is formed in a one chip by arranging into lattice shape a plurality of light receiving cells respectively of an equal surface area as seen from the side of the light emitting diode and connected in series with one another.

Upon presence of a light input onto the light receiving element of the photovoltaic diode array from such light source as the light emitting diode in the above arrangement, there is caused a photoelectric current generated in the respective light receiving cells in proportion to the light amount reached from the light source. Since the respective light receiving cells are of the equal surface area, the photoelectric current generated in one of the cells at a position farther than others from the light source is to be smaller, and it has been found that the photoelectric current obtainable for the entire light receiving element is to be the minimum one of the currents generated within the respective light receiving cells or, in other words, the photoelectric current generated in the farthest positioned light receiving cell from the light source. Accordingly, there has been a problem that the photoelectric currents generated in the light receiving cells closer to the light source are subjected to a considerable extent of loss so as to eventually lower the light reception efficiency for the entire light receiving element.

FIELD OF ART

It is the primary object of the present invention, therefore, to provide a light receiving element capable of improving to a large extent the light receiving efficiency and still allowing required chip size for forming the element in one chip to be effectively minimized.

According to the present invention, this object may be realized by forming the light receiving element with a plurality of light receiving cells connected in series with one another and arranged for optical coupling to a light source, the cells having respectively a surface area varied depending on light input intensity from the light source.

In the light receiving element according to the present invention, the photoelectric currents generated within the respective light receiving cells responsive to the light input from the light source are substantially equal to one another, so that no loss in the photoelectric current will take place in any one of the cells due to difference in the distance from the light source so as to maintain an excellent light receiving efficiency obtainable as a whole of the light receiving element, and the entire dimension of the element can be made smaller so as to allow the required chip size for forming the element in one chip to be minimized.

Other objects and advantages of the present invention shall be made clear in following description of the invention detailed with reference to embodiments shown in accompanying drawings.

BRIEF EXPLANATION OF THE DRAWINGS

FIG. 6 is a plan view showing a state in which the light receiving cells are circularly arranged in another embodiment of the present invention.

While the present invention shall now be referred to with reference to the respective embodiments shown in the accompanying drawings, it should be appreciated that the intention is not to limit the present invention only to the embodiments shown but to rather include all design modifications, alterations and equivalent arrangements possible within the scope of appended claims.

DISCLOSURE OF PREFERRED EMBODIMENTS

Figure 1:
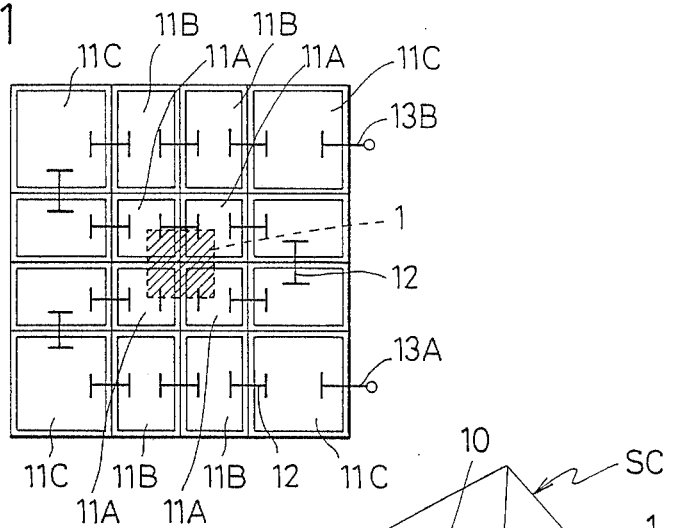
FIG. 1 is a plan view showing a state in which the light receiving cells are arrange in an embodiment of the light receiving element according to the present invention.
Figure 2:
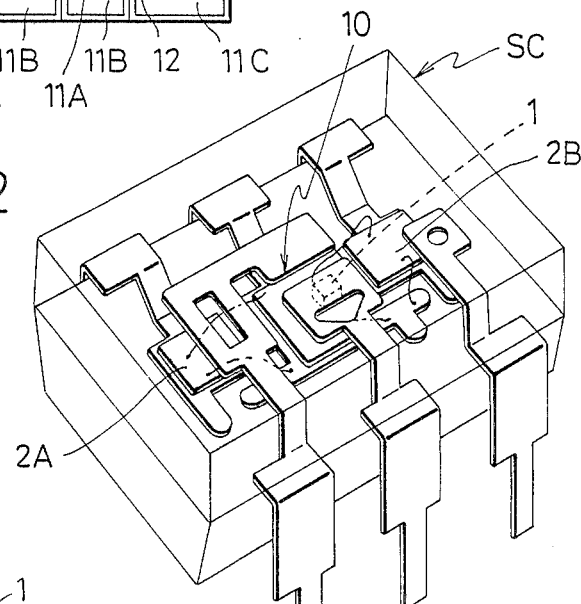
FIG. 2 is a perspective view showing schematically a semiconductor switching device as a typical one of examples in which the light receiving element of FIG. 1 is employed.
Figure 3:
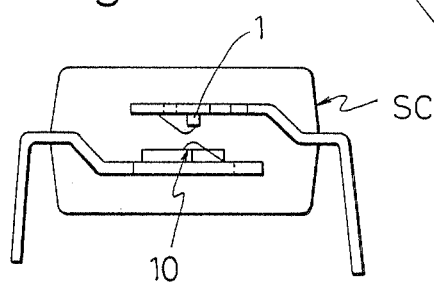
FIG. 3 is an explanatory view for showing positional relationship between the light source and the light receiving element in the switching device of FIG. 2.

Referring to FIG. 1 showing a light receiving element 10 as an embodiment of the present invention, this light receiving element 10 comprises three groups of light receiving cells 11A ..., 11B ... and 11C ... which are receiving a light input from such a light source 1 as a light-emitting diode. In the present instance, sixteen light receiving cells 11A ..., 11B ... and 11C ... are connected in series with one another through connecting lines 12, as arranged in a lattice shape to be optically coupled to a light source 1 opposed in vertical relationship to light receiving surface of the cells, as will be clear when FIGS. 2 and 3 are jointly referred to. Further, a pair of electrodes 13A and 13B are connected respectively to the first and last stage light receiving cells in the series connected array of the cells 11A through 11C.

Here, the respective light receiving cells 11A through 11C of the series array are provided to vary in their light receiving surface area depending on the intensity of light input from the light source 1. That is, in the illustrated embodiment, four light receiving cells 11A disposed closest to the light source are made small in their light receiving area, and other four light receiving cells 11C disposed at farthest corner positions of the lattice shape are made to be large in their light receiving area, while remaining eight light receiving cells 11B at an intermediate distance between the closest cells 11A and the farthest cells 11C are to be of an intermediate area. In view that, as a general rule, the light intensity reduces in square multiple of the distance, the farthest group of the light receiving cells 11C are required to have a light receiving area four times as large as that of the closest group of the cells 11A the area of which is regarded to be a reference size 1 so long as the cells 11C are at a distance twice as large as the cells 11A with respect to the light source. In other words, the light receiving area of the closet cells 11A is made to be a quarter of that of the farthest cells 11C. The intermediate positioned light receiving cells 11B are made to be twice as large, in the light receiving area, as that of the closest cells 11A when the intermediate cells 11B are disposed one and half times farther than the closest cells 11A from the light source 1. In other words, the light receiving area of the intermediate cells 11B is made to be one half of that of the farthest cells 11C.

It is necessary, for increasing the generated photoelectric current, to enlarge the light receiving area of the light receiving cells and, when the cells are arranged in the lattice shape, the area of the cell at the farthest position from the light source 1 will be taken as the reference of the intensity of the current obtained, as will be clear from the foregoing. In any known light receiving element, all of the light receiving cells are of the same area so that the total area of the entire light receiving cells will have to become extremely large to render required chip size for forming the light receiving element in one chip to be disadvantageously larger. According to the present embodiment, on the other hand, the light receiving cells 11A closest to the light source 1 can be made ¼ in the light receiving area of that of the farthest cells 11C while the intermediate cells 11B can be ½, even when the area of the farthest positioned cells 11C which is the reference for the obtainable photoelectric current is made larger.

In the case of a known light receiving element of, for example, sixteen light receiving cells which are arranged in the lattice shape as made in a single chip, the required chip size will be about four times as large as a total area of four light receiving cells at four corners of the lattice shape. In the present embodiment of the invention, on the other hand, the required chip size of the element with similarly sixteen light receiving cells will be limited to be about 2.25 times as large as the total area of the four cells 11C at four corners. Accordingly, it will be appreciated that, in obtaining the same level of the photoelectric current, the light receiving element 10 according to the present invention may be provided only with a light receiving area which is almost one half of that of the known element, and can be remarkably contributive to the minimization of the required chip size.

It will be of course possible to employ the same chip size for the light receiving element 10 of the present invention as that of the known element, in which event the four light receiving cells at the four corners can be made larger in the area and thus in the obtainable photoelectric current than those of the known element. In the foregoing embodiment, the light receiving element has been shown to comprise sixteen light receiving cells 11A through 11C as an example, but the number of the cells may be properly varied in the present invention.

Further, the foregoing light receiving element 10 can be effectively employed as a diode array in such semiconductor switching circuit as has been disclosed in, for example, an earlier U.S. patent application Serial No. 78,791 (German patent application P 37 26 682.9, British patent application No. 87 18919, or French patent application No. 87 11362 of the same assignee as the present invention, in which event, as shown in FIGS. 2 and 3, the light receiving element 10 may be effectively utilized in a switching circuit SC as opposed through a clearance to such light source 1 as the light-emitting diode and as connected at output ends of the element 10 to input ends of MOSFET's 2A and 2B.

Figure 4:
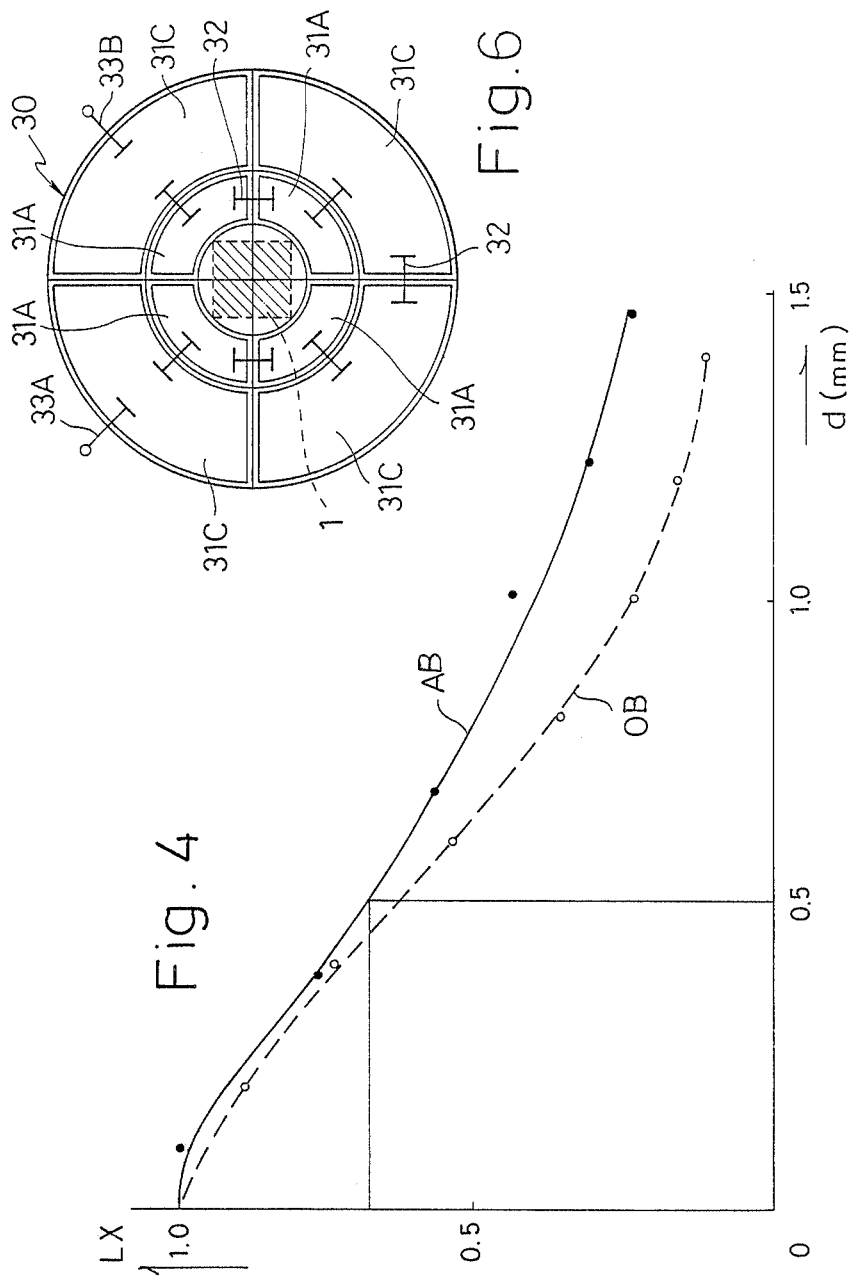
FIG. 4 is a diagram showing relationship between horizontal distance from the light source to the respective light receiving cells and relative illuminance, in both of computed values and actually measured values.
Figure 5:
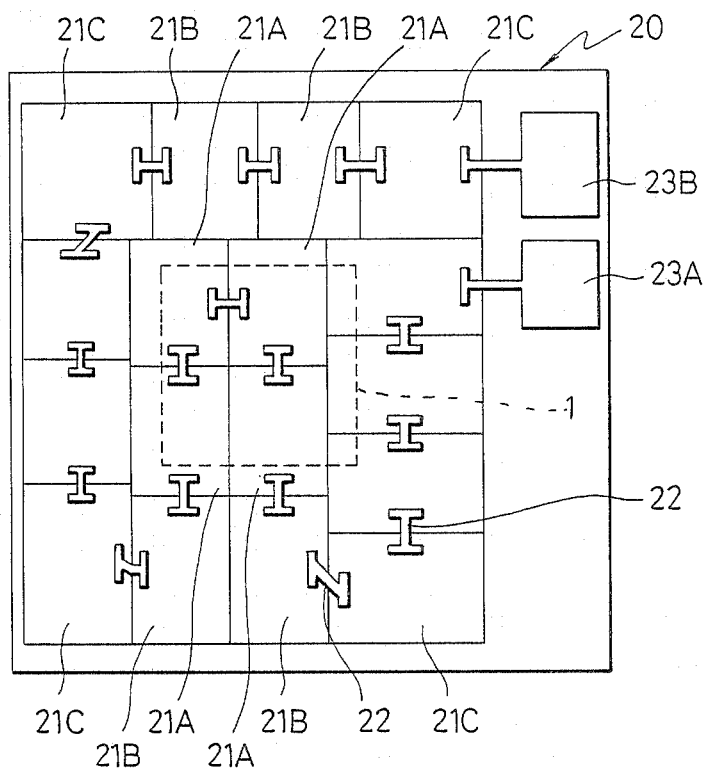
FIG. 5 is a plan view showing a state in which the light receiving cells are arranged in an optimum embodiment of the light receiving element according to the present invention.

As shown in FIG. 4, the relationship between the distance d (mm) of the light receiving cells from the light source and the illuminance Lx in the light receiving element in which the light receiving cell area is varied depending on the intensity of input light from the light source, has been obtained both in the computed values OB and actually measured values AB, in view of the result of which it has been observed that, in the actually measured values AB, the illuminance shows a slightly smaller drop with respect to the distance than in the case of the computed values OB. In FIG. 5, there is shown, as another embodiment, one of best models designed on the basis of these data, in which embodiment the light receiving element 20 is made to be of a chip size of 1.2×1.2 mm, light receiving cells 21A . . . , 21B . . . and 21C . . . are optically coupled to a light source 1 (light-emitting diode) of a width of 0.4 mm and disposed above the center of the cells which are arranged in a slightly modified lattice shape. When the light receiving area of the cells 21C farthest from the light source 1 is made 1.0, the closest cells 21A are made to be of the light receiving area of 0.8, and the intermediate cells 21B are of the area of 0.9. Other arrangements and operation of this embodiment are substantially identical to those in the embodiment of FIG. 1, and substantially the same members as in the FIG. 1 embodiment are shown here with the same reference numerals as in FIG. 1 but as added by 10.

Referring here to FIG. 6, there is shown a further embodiment of the light receiving element according to the present invention, in which a light receiving element 30 of a circular configuration is provided. In this element 30, inner positioned, sector-shaped light receiving cells 31A closest to the light source 1 are made to be of a smaller light receiving area, whereas outer positioned, sector-shaped light receiving cells 31C are of a larger light receiving area. In the present embodiment, other arrangements and operation are substantially the same as those in the embodiment of FIG. 1, and substantially the same members in the embodiment of FIG. 6 are denoted by the same reference numerals as in FIG. 1 but as added by 20.

Figure 7:
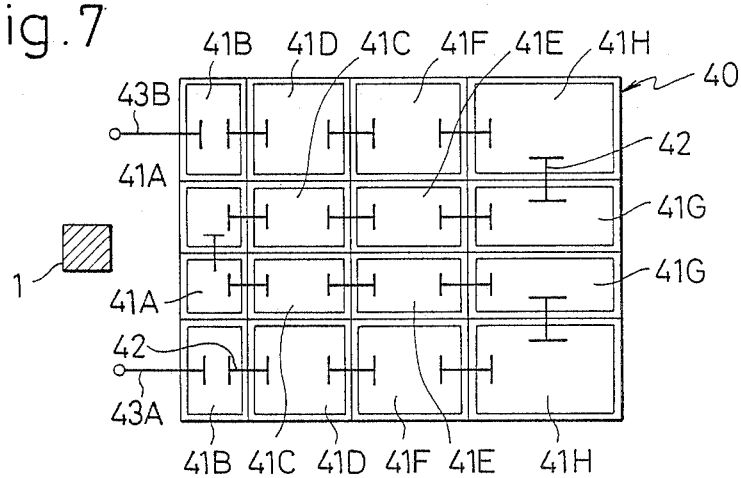
FIG. 7 is a plan view showing a state in which the light receiving cells optically coupled to a light source disposed on a lateral side of the cells.

In a still further embodiment shown in FIG. 7, a light receiving element 40 is provided for receiving a light input from a light source 1 disposed on a lateral side. In this embodiment, eight groups of light receiving cells 41A through 41H of varying light receiving areas, in contrast to such three groups or two groups variations in the light receiving area as in the foregoing embodiment, are arranged in dependence on the distance from the light source 1. In the present embodiment, other arrangements and operation are substantially the same as those of FIG. 1 and substantially the same members as in FIG. 1 are denoted by the same reference numerals as in FIG. 1 but as added by 30.

In the present invention, various design modifications are possible. For example, in the respective embodiments of FIGS. 1, 5 and 6, the light receiving area of the cells is varied in three or two groups or stages depending on the distance from the light source 1, but the area can be varied in a larger number of stages as required, in such manner as in the embodiment of FIG. 7.

What we claim as our invention is:

1. A light receiving element comprising a plurality of light receiving cells connected in series with one another and arranged to be optically coupled to a light source, wherein said light receiving cells having respectively a surface area varying depending on the intensity of light input from said light source.

2. An element according to claim 1, wherein said surface area of said light receiving cells is made smaller for the cells positioned relatively closer to said light source so that said light input intensity will be larger, but is made larger for the cells positioned relatively farther from the light source to be of a smaller light input intensity.

3. An element according to claim 1, wherein the entire light receiving surface of all of said light receiving cells is vertically opposed to said light source.

4. An element according to claim 1, wherein the entire light receiving surface of all of said light receiving cells is disposed to be lateral with respect to said light source.

* * * * *